(12) United States Patent
Shibayama

(10) Patent No.: US 7,702,198 B2
(45) Date of Patent: Apr. 20, 2010

(54) SEMICONDUCTOR LASER MODULE AND LIGHT SCANNING DEVICE AND IMAGE FORMING APPARATUS USING THE SAME

(75) Inventor: Yasuyuki Shibayama, Hitachinaka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/206,392

(22) Filed: Sep. 8, 2008

(65) Prior Publication Data
US 2009/0087142 A1    Apr. 2, 2009

(30) Foreign Application Priority Data

Sep. 28, 2007  (JP) ............................. 2007-252811
Mar. 21, 2008  (JP) ............................. 2008-073837

(51) Int. Cl.
*G02B 6/32*    (2006.01)
*G02B 6/42*    (2006.01)

(52) U.S. Cl. ............................. 385/33; 385/88; 385/92; 385/93

(58) Field of Classification Search ....................... None
See application file for complete search history.

(56) References Cited

U.S. PATENT DOCUMENTS

| 4,805,976 A | 2/1989 | Wilkening et al. |
| 5,074,682 A | 12/1991 | Uno et al. |
| 6,793,406 B1 * | 9/2004 | Edwards et al. ............... 385/88 |
| 2003/0012496 A1 * | 1/2003 | Yamagata et al. ............ 385/33 |

FOREIGN PATENT DOCUMENTS

| JP | 60-191211 A | 9/1985 |
| JP | 62-272212 A | 11/1987 |
| JP | 5-196845 A | 8/1993 |
| JP | 5-241026 A | 9/1993 |
| JP | 6-12367 B2 | 2/1994 |
| JP | 7-119857 B2 | 12/1995 |
| JP | 2005-215426 A | 8/2005 |
| JP | 2005-064219 | 10/2005 |
| JP | 2006-165194 A | 6/2006 |
| JP | 2007-41516 A | 2/2007 |
| JP | 2007-73870 A | 3/2007 |

* cited by examiner

*Primary Examiner*—Tina M Wong
(74) *Attorney, Agent, or Firm*—Crowell & Moring LLP

(57) ABSTRACT

An angle β between a principal ray of incident light incident on an optical fiber via a lens system and a marginal ray of reflected light nearest to the principal ray of the incident light when the reflected light is the incident light reflected on an entrance end surface of the optical fiber is larger than an angle θ between the principal ray and a marginal ray of the incident light. A receiving surface is provided separately from an inner surface of a light-passing hole so that the reflected light is received by the receiving surface. Therefore, the reflected light from the entrance end surface of the optical fiber is prevented from returning to a semiconductor laser light source to thereby attain improvement in stability and high reliability of laser light output of the semiconductor laser light source.

18 Claims, 10 Drawing Sheets

SEMICONDUCTOR LASER MODULE AND LIGHT SCANNING DEVICE AND IMAGE FORMING APPARATUS USING THE SAME

BACKGROUND AND SUMMARY OF THE INVENTION

The present invention relates to a semiconductor laser module for coupling light emitted from a semiconductor laser light source to an optical fiber, and a light scanning device and an image forming apparatus using the same.

A semiconductor laser module by which light emitted from a semiconductor laser light source is efficiently led into a single mode optical fiber has been heretofore widely used chiefly in the field of optical communication. The single mode optical fiber has the advantage of small core diameter and low transmission loss.

FIG. 14 is a view showing a structure of a system for coupling a semiconductor laser light source and an optical fiber to each other according to the background art. As shown in FIG. 14, laser light emitted from a semiconductor laser light source 21 passes through lenses 22 and 23 so as to be led into an optical fiber 24 held in an optical fiber holding member 25. In this case, the optical axis of the laser light coincides with the central axis of the optical fiber 24.

An entrance end surface of the optical fiber 24 is polished so as to be perpendicular to the direction of the optical axis. Generally, reflected light of about 4% is generated in an interface between the air and a glass surface which is an end surface of the optical fiber 24 not subjected to anti-reflection processing. For this reason, the reflected light from the end surface of the optical fiber 24 passes through the lenses 23 and 22 again and returns to a laser oscillation portion of the semiconductor laser light source 21. Accordingly, there is a problem that the laser light output becomes unstable.

FIGS. 15 and 16 are views showing structures of systems for coupling semiconductor laser light sources and optical fibers to each other in order to solve the problem of such unstable laser light output. The structures have been disclosed in Patent Documents 1 and 2 respectively.

As shown in FIG. 15, in Patent Document 1, an optical fiber 24 having an entrance end surface polished obliquely with respect to the direction of the optical axis is used so that the direction of movement of reflected light from the entrance end surface of the optical fiber 24 is deflected to a direction different from the angle of incident light. Moreover, a semiconductor laser light source 21 and a lens 22 are shifted from the optical axis of the optical fiber 24 and another lens 23 nearer to the optical fiber 24 to make laser light incident obliquely on the optical fiber 24 so that the direction of movement of light refracted at the entrance end surface and made incident on the optical fiber 24 coincides with the axis of the optical fiber 24.

As shown in FIG. 16, in Patent Document 2, an optical fiber 24 having an entrance end surface polished obliquely with respect to the direction of the optical axis is used in the same manner as in FIG. 15 so that the direction of movement of reflected light from the entrance end surface of the optical fiber 24 is deflected to a direction different from the angle of incident light. Moreover, there is provided a structure that an angle of inclination is given to a semiconductor laser light source 21 itself.

Other proposals have been described in Patent Documents 3 and 4. Patent Document 3 has disclosed a method for setting an angle of inclination of the axial center of a single mode optical fiber with respect to the optical axis of a beam emitted from a light source having an elliptic near-field pattern and setting an angle of inclination of a perpendicular line dropped from the entrance end surface with respect to the axial center of the single mode optical fiber.

Patent Document 4 has disclosed a method in which: a linearly polarized beam is used as a laser beam incident on an optical fiber; the laser beam is made incident on the optical fiber so that an angle of incidence with respect to the entrance end surface of the optical fiber is a Brewster angle; and the angle of the entrance end surface of the optical fiber is set so that the laser beam is parallel to the axis of the optical fiber.

Any of the aforementioned Patent Documents 1 to 4 employs a method in which the direction of movement of reflected light from the entrance end surface of the optical fiber is deflected to a direction different from the angle of incident light.

A method different from those in Patent Documents 1 to 4 has been disclosed in Patent Document 5. That is, Patent Document 5 has disclosed a method for an optical module having a receptacle, in which a return light preventing unit is provided in part of an inner wall surface of the receptacle.

Patent Document 1: JP-B-7-119857
Patent Document 2: JP-B-6-12367
Patent Document 3: JP-A-60-191211
Patent Document 4: JP-A-5-196845
Patent Document 5: JP-A-2007-41516

The optical system described in each of Patent Documents 1 and 2 however has a disadvantage that aberration increases because marginal rays of light incident on the optical fiber are displaced largely from the optical axes of the lenses 22 and 23.

Although means for eliminating the disadvantage of Patent Documents 1 and 2 has been described in Patent Documents 3 and 4, there is no consideration about how to prevent reflected light from returning to the laser oscillation portion.

In Patent Document 5, the optical module having the receptacle is configured so that the return light preventing unit is provided in part of the inner wall surface of the receptacle. However, there is no consideration about how to prevent reflected light from returning to the laser oscillation portion.

As another unit for preventing reflected light from returning to an oscillation portion of a semiconductor laser light source in a semiconductor laser module, there is a method using an optical isolator (i.e. an element as a combination of a Faraday rotator and a polarizer) in the semiconductor laser module. Although an RIG (Rare Earth Iron Garnet) film is used as a Faraday rotator for optical communication, the RIG film cannot be used for a short-wavelength laser because the RIG film contains iron so that the RIG film does not transmit visible light with a wavelength of 1 μm or shorter unless the RIG film is considerably thin.

Therefore, TGG (Terbium Gallium Garnet) is used as a rotator for a short-wavelength region. It is however necessary to make the optical path length longer because the rotation angle per unit thickness of TGG is small. To make TGG function as an optical isolator, a large size of several cm is required. Moreover, a powerful and large magnet is required because it is necessary to apply a uniform and intensive magnetic field to TGG in order to obtain high isolation.

In a semiconductor laser module in which an optical fiber and an incident beam have to be aligned with each other in high accuracy of the order of microns, thermal expansion of constituent members is not negligible. Lowering of reliability is therefore caused by increase in size of the semiconductor laser module and expansion of the optical path length. For the aforementioned reason, the optical isolator using TGG has a problem that increase in size of the module is not avoidable.

SUMMARY OF THE INVENTION

A first object of the present invention is to provide a semiconductor laser module in which reflected light on an entrance end surface of an optical fiber is prevented from returning to a semiconductor laser light source to thereby attain stability and high reliability of laser light output of the semiconductor laser light source.

A second object of the invention is to provide a light scanning device which can attain stability and high reliability of laser light output.

A third object of the invention is to provide an image forming apparatus which can obtain a high-quality image.

To achieve the first object, according to a first aspect of the invention, there is provided a semiconductor laser module including a semiconductor laser light source, an optical fiber, a lens system by which light emitted from the semiconductor laser light source is condensed on an entrance end surface of the optical fiber, and a holding member which has a light-passing hole formed in the holding member and which holds the semiconductor laser light source in one end portion of the light-passing hole, the optical fiber in the other end portion of the light-passing hole and the lens system in an intermediate portion of the light-passing hole, wherein: angles of arrangement of the lens system and the optical fiber are set so that an angle β between a principal ray of optical fiber incidence light incident on the optical fiber via the lens system and a marginal ray of reflected light nearest to the principal ray of the optical fiber incidence light when the reflected light is the optical fiber incidence light reflected on the entrance end surface of the optical fiber is larger than an angle θ between the principal ray and a marginal ray of the optical fiber incidence light; and a receiving surface is provided near the other end portion of the light-passing hole and separately from an inner surface of the light-passing hole so that the reflected light is received by the receiving surface.

According to a second aspect of the invention, there is provided a semiconductor laser module according to the first aspect, wherein the direction of movement of a principal ray of light refracted at the entrance end surface of the optical fiber coincides with the direction of an optical axis of the optical fiber.

According to a third aspect of the invention, there is provided a semiconductor laser module according to the first aspect, wherein the oscillation wavelength of the semiconductor laser light source is not longer than 450 nm.

According to a fourth aspect of the invention, there is provided a semiconductor laser module according to the first aspect, wherein the receiving surface is provided in a direction perpendicular to the inner surface of the light-passing hole.

According to a fifth aspect of the invention, there is provided a semiconductor laser module according to the first aspect, wherein the receiving surface is covered with a light-absorbing layer which absorbs the oscillation wavelength of the reflected light.

According to a sixth aspect of the invention, there is provided a semiconductor laser module according to the fifth aspect, wherein at least a part of the inner surface of the light-passing hole near the receiving surface is also covered with the light-absorbing layer.

According to a seventh aspect of the invention, there is provided a semiconductor laser module according to the fifth or sixth aspect, wherein the holding member is made of metal while the light-absorbing layer is made of black chrome plating.

According to an eighth aspect of the invention, there is provided a semiconductor laser module according to any one of the first and fourth to seventh aspects, wherein the receiving surface is formed from a light-blocking hole which is formed near an end portion of the holding member so as to communicate with the light-passing hole and which has an opening portion blocked.

According to a ninth aspect of the invention, there is provided a semiconductor laser module according to any one of the first and fourth to seventh aspects, wherein the receiving surface is formed from an inner surface of a light-blocking recess which is formed near an end portion of the holding member.

To achieve the second object, according to a tenth aspect of the invention, there is provided a light scanning device including at least two semiconductor laser modules using single mode optical fibers respectively, an optical fiber array portion formed by arrangement of exit ends of the optical fibers of the semiconductor laser modules, and an optical deflecting element for deflecting and scanning light exiting from the optical fiber array portion so that light deflected by the optical deflecting element is scanned on a scanning surface, wherein each of the semiconductor laser modules is a semiconductor laser module according to any one of the first to ninth aspects.

To achieve the third object, according to an eleventh aspect of the invention, there is provided an image forming apparatus including a photoconductor, an electrostatically charging device for electrostatically charging a surface of the photoconductor, a light scanning device for forming an electrostatic latent image by irradiating light on the electrostatically charged surface of the photoconductor, a developing device for forming a toner image by depositing toner on the electrostatic latent image, a transfer device for transferring the toner image onto a recording medium, and a fixing device for fixing the transferred toner image on the recording medium, wherein the light scanning device is a light scanning device according to the tenth aspect.

Since the semiconductor laser module according to the invention is formed to have a structure in which light reflected on the entrance end surface of the optical fiber is prevented from returning to the semiconductor laser light source, it is possible to achieve stability and high reliability of laser light output of the semiconductor laser module.

Since the light scanning device according to the invention is formed to have a structure in which light reflected on the entrance end surface of the optical fiber is prevented from returning to the semiconductor laser light source, it is possible to achieve stability and high reliability of laser light output of the semiconductor laser module.

The image forming apparatus according to the invention can achieve formation of a high-quality image.

DETAILED DESCRIPTION OF THE PREFERRED EMBODIMENTS

Embodiments of the present invention will be described below with reference to the drawings.

Embodiment 1

Figure 1:
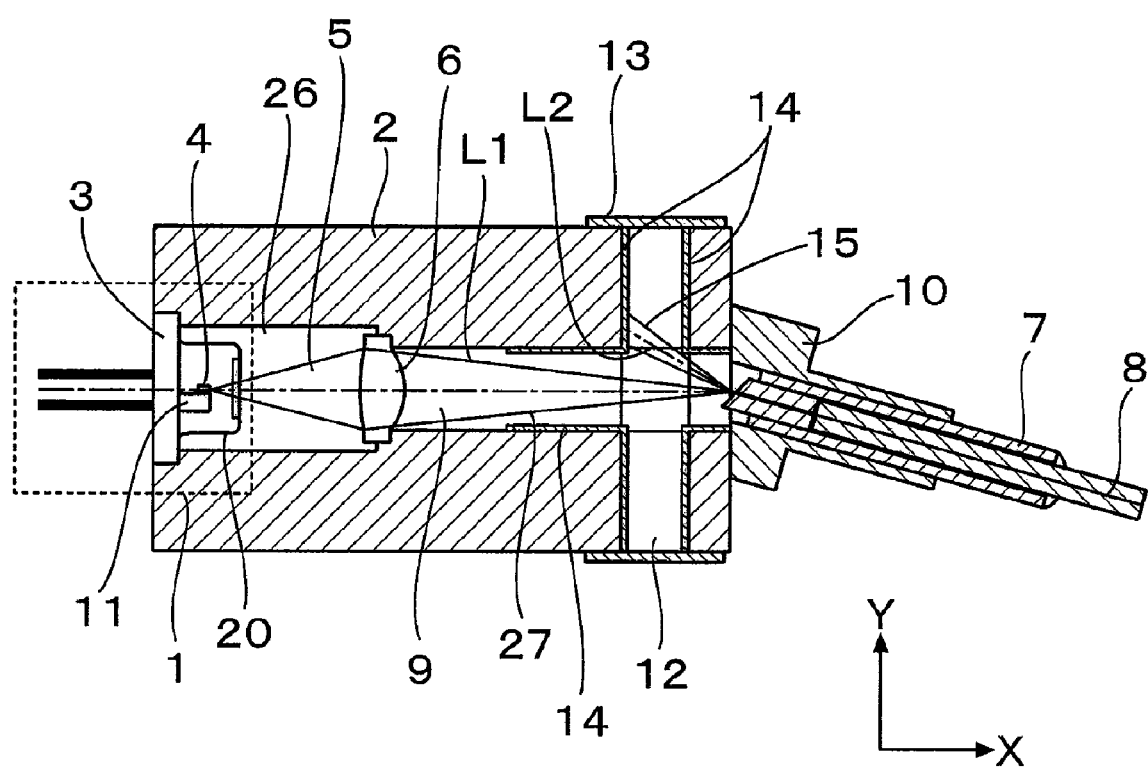
FIG. 1 is a sectional view of a semiconductor laser module according to Embodiment 1 of the invention.

FIG. 1 is a sectional view of a semiconductor laser module according to Embodiment 1 of the invention.

A semiconductor laser light source 1 is formed so that a laser chip 4 for emitting laser light and a photo-detector element (not shown) for receiving the laser light are disposed on a surface of a sub-mount heat sink connection 11 connected to a stem 3. As for the configuration of the connection 11, a heat sink is disposed on a surface of the stem 3, a sub-mount is connected to a surface of the heat sink different from the surface on which the heat sink is connected to the stem 3, and the laser chip 4 and the photo-detector element are disposed on a surface of the sub-mount different from the surface on which the sub-mount is connected to the heat sink. The stem 3 is covered with an LD cap 20 to thereby form an integral type structure which is sealed hermetically.

The semiconductor laser light source 1 is fixed in such a manner that the stem 3 is connected into a cylindrical setting hole 26 provided in the center of a holding member 2. The setting hole 26 and a light-passing hole 27 provided in front of the setting hole 26 extend continuously in an X-axis direction in FIG. 1. A lens system 6 is held in a boundary portion between the setting hole 26 and the light-passing hole 27.

A light-blocking hole 12 extending in a Y-axis direction, that is, extending in a direction perpendicular to the axial direction of the light-passing hole 27 is formed so as to pass through in a front portion of the holding member 2 to which an optical fiber 8 is attached. The light-blocking hole 12 and the light-passing hole 27 cross each other in the middle of the light-blocking hole 12. Upper and lower opening portions of the light-blocking hole 12 are sealed with a sealing material 13 such as an aluminum pressure-sensitive adhesive tape stuck on a circumferential surface of the holding member 2. Accordingly, the semiconductor laser light source 1, the lens system 6 and the light-blocking hole 12 are arranged in this order in view of the setting hole 26 toward the light-passing hole 27.

Although the cylindrical holding member 2 is used in this embodiment, any shape such as a rectangular pipe shape may be used. The shape of each of the setting hole 26, the light-passing hole 27 and the light-blocking hole 12 is not limited to the cylindrical shape. The structure of the semiconductor laser light source 1 is not limited to the aforementioned structure.

The optical fiber 8 is held in the inside of a ferrule 7. One end portion of the ferrule 7 is inserted and connected into the inside of a sleeve 10. A base end portion of the sleeve 10 is connected to an end surface of the holding member 2 opposite to the end surface to which the semiconductor laser light source 1 is fixed, by means of welding, bonding, etc.

A blue semiconductor laser light source with an oscillation wavelength of 405 nm for radiating laser light near ultraviolet light is used as the semiconductor laser light source 1. The laser chip 4 of the semiconductor laser light source 1 serves as a light-emitting portion from which light 5 is emitted. The light 5 moves in a course coaxial with the optical axis of the lens system 6. That is, the light 5 passes through the lens system 6, then converges as optical fiber incidence light 9 on an entrance end surface of the single mode optical fiber 8 and enters into a core which is a light propagation region of the optical fiber 8.

On this occasion, to make incident light 9 enter into the optical fiber 8 efficiently, it is necessary to make the size of a converged light spot as coincident with the size of the core of the optical fiber 8 as possible. In the lens system 6, it is necessary to adjust the converged light spot of the incident light 9 to a size appropriate to the core size of the optical fiber 8. Therefore, a lens or a lens set having a predetermined magnification decided based on the size of the laser chip 4 and the core size is used.

Figure 2A:
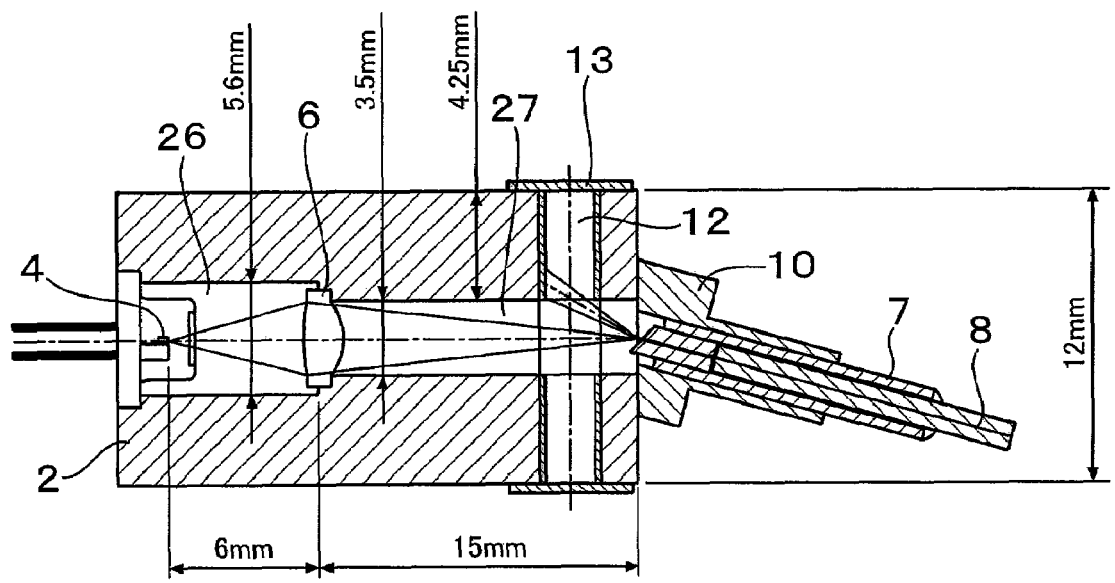
FIGS. 2A and 2B are dimensional views showing dimensions of respective parts of the semiconductor laser module.

Specific dimensions of respective portions of the semiconductor laser module will be described with reference to FIGS. 2A and 2B. As shown in FIG. 2A, the holding member 2 is shaped like a cylinder having a diameter of 12 mm. The distance from the laser chip 4 to the lens system 6 is 6 mm. The distance from the lens system 6 to the entrance end surface of the optical fiber 8 is 15 mm.

The diameter of the setting hole 26 is 5.6 mm. The diameter of the light-passing hole 27 is 3.5 mm. The distance from a side surface of the holding member 2 to a side surface of the light-passing hole 27 is 4.25 mm. As shown in FIG. 2B, the diameter of the light-blocking hole 12 is 1 mm, and the distance from the center of the light-blocking hole 12 to the end surface to which the optical fiber 8 is connected is 5.1 mm. Incidentally, dimensions 4.6 mm and 5.6 mm which are distances to the side surface of the light-blocking hole 12 are shown in FIG. 2B.

The size of the laser chip 4 is generally from about 0.5 to 2 μm. When a single mode optical fiber for a visible light range is used as the optical fiber 8, the diameter of a section of the core portion of the optical fiber 8 is from 4 to 5 μm, that is, very small.

Figure 3A:
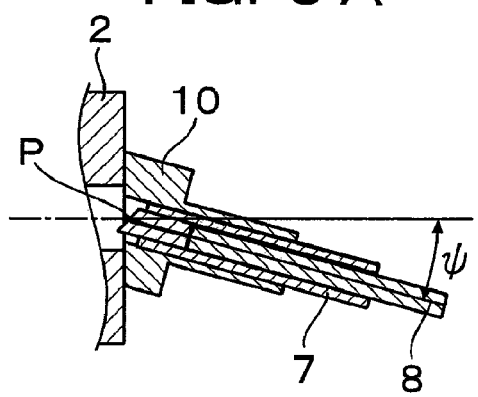
FIGS. 3A to 3C are views for explaining connection between a holding member and an optical fiber.
Figure 3B:
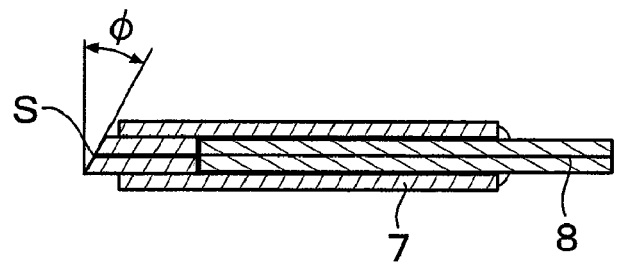
Figure 3C:
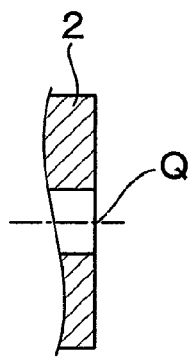
Figure 3C:
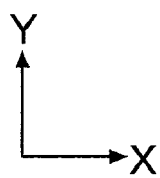

FIGS. 3A to 3C are views for explaining connection between the holding member and the optical fiber. FIG. 3A is a partly sectional view showing a state where the optical fiber is connected to the holding member. FIG. 3B is a sectional view of the optical fiber held in the ferrule. FIG. 3C is a sectional view of a front end portion of the holding member.

When a single mode optical fiber for a visible light range is used, the diameter of a section of the core portion of the optical fiber 8 becomes very small. It is therefore necessary to make the semiconductor laser output light 5 enter into the core portion without lowering of efficiency. As to an assembling method, it is therefore necessary to perform assembling after the converged light spot point P shown in FIG. 3A is aligned with the core portion of the optical fiber 8 in the order of sub-microns by use of a high-accuracy aligner. As to a specific handling method of the high-accurate aligner, the ferrule 7 holding the optical fiber 8 is grasped so that a point S of the optical fiber 8 shown in FIG. 3B is made coincident with a point Q of the holding member 2 shown in FIG. 3C. The point S of the optical fiber 8 is a central point of the laser incidence end surface. The point Q of the holding member 2 is a point of intersection between the end surface of the holding member 2 and the principal ray of the optical fiber incidence light 9.

Since the intensity of output light from the optical fiber 8 is maximized when the points S and Q coincide with each other, judgment can be made from the intensity of output light as to whether the point S of the optical fiber and the point Q of the holding member 2 coincide with each other. Incidentally, a point at which the points S and Q coincide with each other is the converged light spot point P.

The sleeve 10 holding the ferrule 7 is used for attaching the optical fiber 8 to the holding member 2. After the optical fiber 8 and the optical fiber incidence light 9 are aligned with each other, the ferrule 7 is connected to the sleeve 10 and the sleeve 10 is connected to the holding member 2. An end surface of the sleeve 10 is polished so as to be inclined at the same angle as an inclination angle $\psi$ of the optical fiber 8 to the axis of the sleeve 10 as shown in FIG. 3A. By fixation of the sleeve 10, the sleeve 10, the ferrule 7 and the optical fiber 8 are fixed while inclined with respect to the end surface of the holding member 2.

The entrance end surface of the optical fiber 8 is polished so as to be inclined with respect to the optical axis of the optical fiber 8. When $\phi$ is an angle from a plane perpendicular to the optical axis of the optical fiber 8 as shown in FIG. 3B, $\psi$ is an angle between the optical axis of the optical fiber 8 held in the sleeve 10 and the principal ray of the optical fiber incidence light 9 as shown in FIG. 3A, and n is the refractive index of the core of the optical fiber 8, $\phi$, $\psi$, and n have a relation represented by the following expression.

$$\sin(\phi+\psi) = n \cdot \sin\phi \quad (1)$$

Since the direction of movement of the principal ray of light refracted at the entrance end surface of the optical fiber 8 and the direction of the optical axis of the optical fiber 8 coincide with each other when this expression (1) is satisfied, loss at connection of the optical fiber can be suppressed.

The fact that light 15 reflected on the entrance end surface of the optical fiber 8 does not return directly to the laser chip 4 which is a light-emitting portion of the semiconductor laser light source 1 will be described below with reference to FIG. 4.

Figure 4:
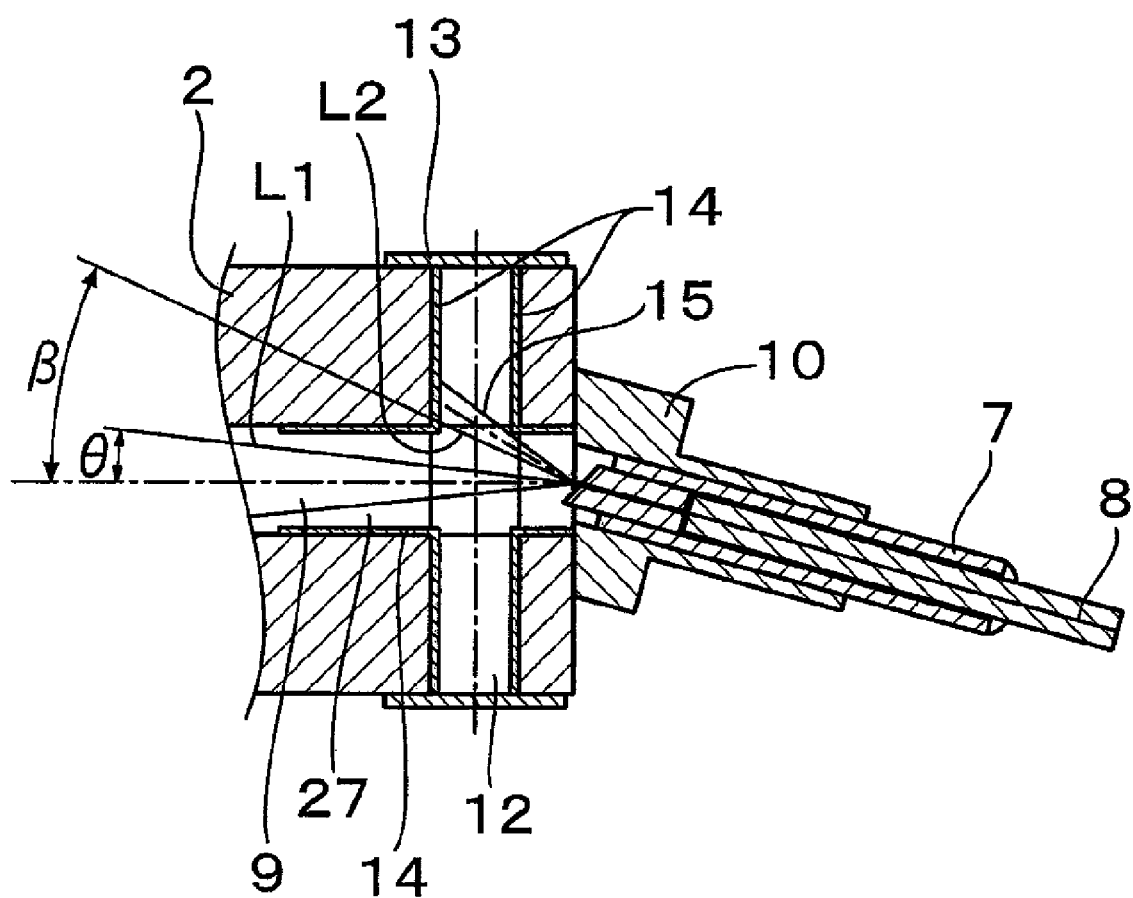
FIG. 4 is a view for explaining the fact that light reflected on an entrance end surface of the optical fiber in the semiconductor laser module is prevented from returning to the laser chip side.

When the aforementioned expression (1) is satisfied, an angle $\beta$ between the principal ray (optical axis) of the optical fiber incidence light 9 and a marginal ray L2 nearest to the principal ray of the optical fiber incidence light 9 in the reflected light 15 from the entrance end surface of the optical fiber is expressed by $\beta = \{2(\phi+\psi) - \theta\}$ in which $\theta$ is an angle between a marginal ray L1 of the optical fiber incidence light 9 and the principal ray of the optical fiber incidence light 9 at the entrance end surface of the optical fiber 8 shown in FIG. 4.

When the relation $\beta > \theta$ is satisfied, the optical fiber incidence light 9 and the reflected light 15 can be separated from each other and the entrance of the reflected light 15 into the laser chip 4 can be suppressed.

When, for example, the wavelength and modal diameter of laser light used in the semiconductor laser module are 405 nm and 4.5 μm respectively, the angle $\theta$ between the marginal ray L1 of the optical fiber incidence light and the principal ray of the optical fiber incidence light is from 3 to 6°. When the oblique polishing angle $\phi$ of the entrance end surface of the optical fiber and the refractive index n of the core of the optical fiber at the wavelength 405 nm of quartz glass used as the material of the optical fiber satisfy $\phi = 8°$ and n=1.47 as the condition of the expression (1) on the assumption that $\theta$ is in a range of 3 to 6°, the angle $\psi$ between the direction of the optical axis of the optical fiber and the direction of movement of the principal ray of light refracted at the entrance end surface of the optical fiber is 3.8°. In this case, since $\beta = \{2(\phi+\psi) - \theta\}$ is in a range of 17.6 to 20.6° and $\theta$ is in a range of 3 to 6°, the relation $\beta = \{2(\phi+\psi) - \theta\} > \theta$ can be satisfied. In this embodiment, a difference of about 11 to 17° is generated between the angle $\theta$ and the angle $\beta$, so that the incident light 9 and the reflected light 15 can be separated from each other.

Although the reflected light 15 from the entrance end surface of the optical fiber can be prevented from returning directly to the laser chip 4 when this relation is satisfied, the light-blocking hole 12 is additionally provided in the invention so that the reflected light 15 can be surely prevented from returning directly to the laser chip 4.

In this embodiment, a light-absorbing layer 14 such as a black chrome thin film which absorbs the oscillation wavelength of the reflected light 15 is further formed on the inner surface of the light-blocking hole 12 by means of plating or the like as shown in FIGS. 1 and 4. The light-absorbing layer 14 made of a chrome thin film has a thickness of 2 to 4 μm and a low reflectance not larger than 10% and exhibits excellent corrosion resistance and heat resistance so that there is no change in external appearance up to 500° C. When the holding member 2 is made of metal such as iron steel, stainless steel, copper, copper alloy, etc., the light-absorbing layer 14 can be easily formed of a black chrome thin film by means of plating. In this embodiment, the light-absorbing layer 14 is formed not only on the inner surface of the light-blocking hole 12 but also on an inner circumferential surface of the optical fiber 8 side opening portion of the light-passing hole 27 so that the reflected light 15 can be blocked more surely. Incidentally, the light-blocking hole 12 is formed in such a position and size that the reflected light 15 from the entrance end surface of the optical fiber can be entirely led in.

An effect of attenuating the reflected light 15 due to the light-blocking hole 12 will be described below based on specific numerical values. Generally, reflected light of about 4% is generated in an interface between the air and a glass surface which is an end surface of the optical fiber not subjected to anti-reflection processing.

Figure 2B:
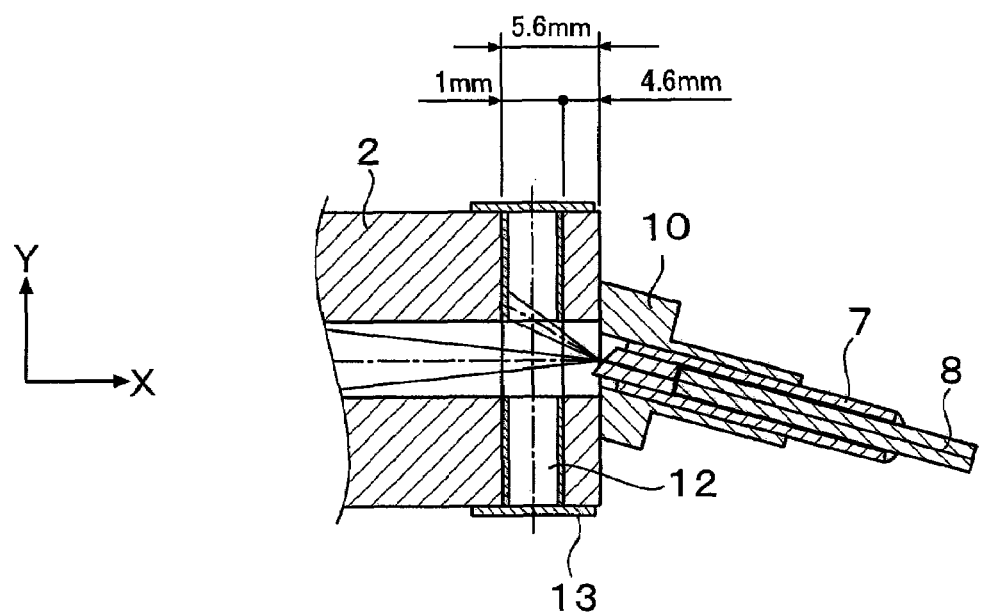

In this embodiment, when the structure of the semiconductor laser module and the dimensional relation as shown in FIGS. 2A and 2B are provided, the reflected light 15 can be entirely led into the light-blocking hole 12 and repeatedly reflected on the inner surface of the light-blocking hole 12 so that the reflected light 15 does not return to the entrance side light-passing hole 27 unless the reflection is repeated five times. On this occasion, since the reflectance of the inner surface of the light-blocking hole 12 where the light-absorbing layer 14 is formed is 10%, the intensity of the reflected light can be attenuated to about $10^{-5}$ by five times repetition of reflection in the light-blocking hole 12.

After the semiconductor laser module is assembled, the light-blocking hole 12 is sealed with a sealing material 13. A material such as an aluminum pressure-sensitive adhesive tape not affected by the reflected light 15 from the entrance end surface of the optical fiber is used as the sealing material 13.

When the light-absorbing layer 14 of a chrome thin film or the like is further provided on the inner surfaces of the setting hole 26 and the light-passing hole 27, the obtained light-attenuating effect becomes more efficient.

Although this embodiment has been described on the case where the light-blocking hole 12 is formed so as to pierce the holding member 2 from one side surface to the other side surface, the invention may be applied to the case where the light-blocking hole 12 is formed so that a front end of the light-blocking hole 12 extending from one side surface of the holding member 2 can reach the light-passing hole 27. In this case, the length of the light-blocking hole 12 can be reduced and the number of sealing materials 13 can be reduced because the number of opening portions is one. The light-blocking hole 12 need not be perpendicular to the light-passing hole 27 and may be inclined at a predetermined angle.

Embodiment 2

Although the aforementioned embodiment has been described on the case where the light-blocking hole 12 is formed in such a manner that a hole is formed in the holding member 2 and opening portions of the hole are blocked, an embodiment will be described below on the case where the hole is not blocked after the formation of the hole.

Figure 5:
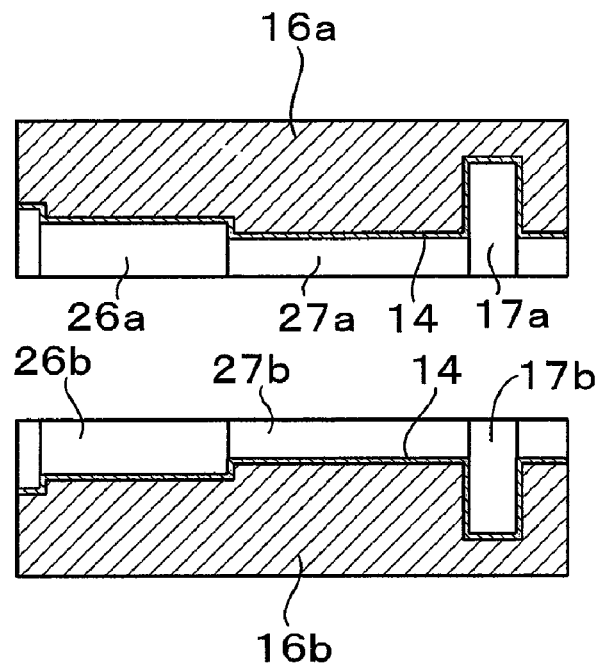
FIG. 5 is an exploded sectional view of a holding member used in a semiconductor laser module according to Embodiment 2 of the invention.

In Embodiment 2 shown in FIG. 5, the holding member 2 is formed from holding member half parts 16a and 16b which are half parts cut along the axial direction of the setting hole 26 and the light-passing hole 27.

Semi-cylindrical setting hole-forming recesses 26a and 26b, light-passing hole-forming recesses 27a and 27b and light-blocking recess-forming recesses 17a and 17b are formed in predetermined positions of the holding member half parts 16a and 16b, respectively. When the holding member half parts 16a and 16b are connected to each other, the holding member 2 having the cylindrical setting hole 26, light-passing hole 27 and light-blocking recess 17 can be formed. In this embodiment, the light-absorbing layer 14 can be provided over the setting hole 26, the light-passing hole 27 and the light-blocking recess 17 because the holding member 2 is divided axially.

Embodiment 3

Figure 6:
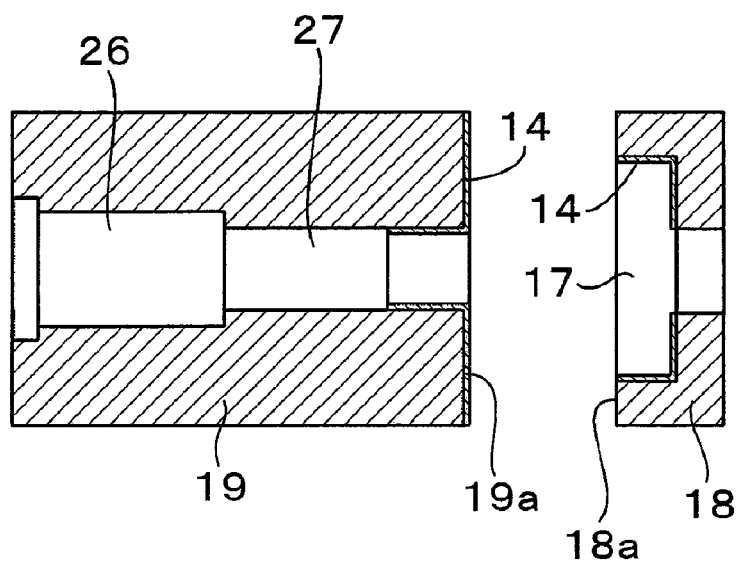
FIG. 6 is an exploded sectional view of a holding member used in a semiconductor laser module according to Embodiment 3 of the invention.

In Embodiment 3 shown in FIG. 6, the holding member 2 is divided into front and rear parts 18 and 19 in a direction perpendicular to the axial direction of the holding member 2 as shown in FIG. 6. A light-blocking recess 17 having one end surface opened is provided in a rear end surface 18a of the front part 18. A large part of the setting hole 26 and the light-passing hole 27 are provided in the rear part 19. When the rear end surface 18a of the front part 18 and a front end surface 19a of the rear part 19 are connected to each other, the light-blocking recess 17 shaped like a cylinder is formed.

The light-absorbing layer 14 is formed on the inner surface of the light-blocking recess 17 provided in the rear end surface 18a of the front part 18 and on a portion of the front end surface 19a of the rear part 19 opposite to the light-blocking recess 17. In this embodiment, the light-absorbing layer 14 is formed on the whole of the front end surface 19a of the rear part 19.

Embodiment 4

Figure 7:
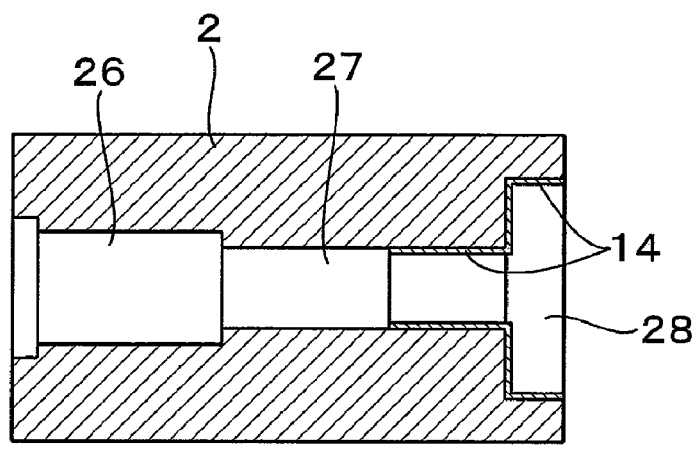
FIG. 7 is a sectional view of a holding member used in a semiconductor laser module according to Embodiment 4 of the invention.

FIG. 7 is a sectional view of a holding member 2 according to Embodiment 4 of the invention. In this embodiment, a light-blocking recess 28 larger in diameter than a light-passing hole 27 is provided near an optical fiber side opening portion of the light-passing hole 27. Since the light-blocking recess 28 can be formed by means of cutting the front end surface of the holding member 2, the holding member 2 need not be divided as shown in FIG. 6 in order to form the light-blocking recess. A light-absorbing layer 14 is formed in a range of from an inner circumferential surface of the light-blocking recess 28 to an inner circumferential surface of the light-passing hole 27. An opening portion of the light-blocking recess 28 is blocked with the sleeve 10.

Though not shown, the reflected light 15 in each of Embodiments 2 to 4 is led into the light-blocking recess 17 or 28 and intensity of the reflected light is attenuated while reflection is repeated several times in the light-blocking recess 17 or 28.

Embodiment 5

Figure 8:
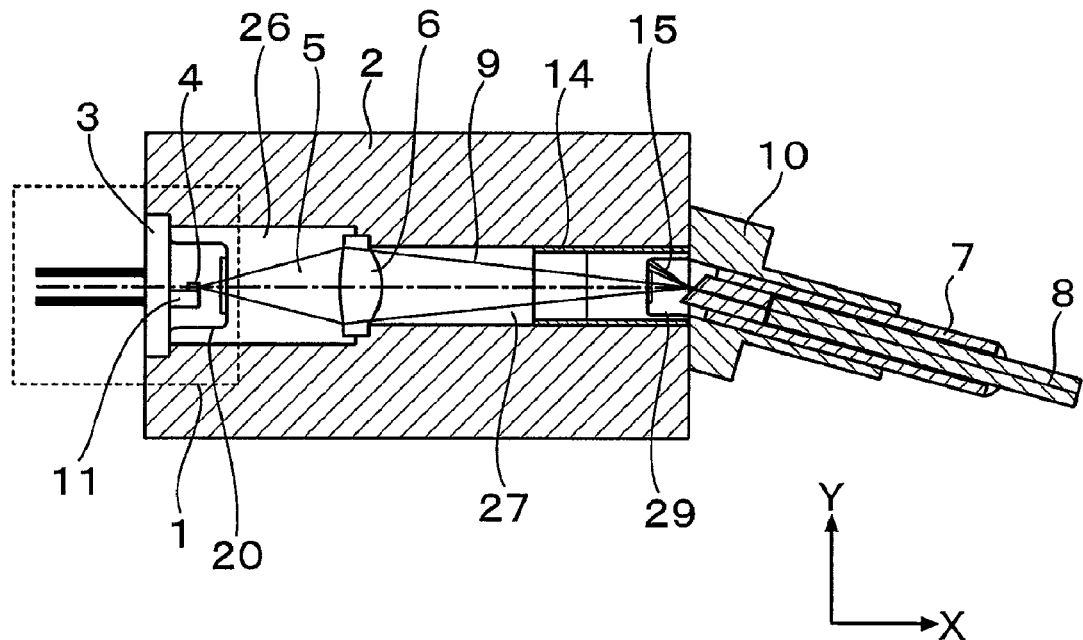
FIG. 8 is a sectional view of a semiconductor laser module according to Embodiment 5 of the invention.

FIG. 8 is a sectional view of a semiconductor laser module according to Embodiment 5 of the invention. The point of difference of this embodiment from Embodiment 1 is in that the light-blocking hole 12 is replaced by a light-blocking member 29 which is disposed in the inside of the optical fiber side opening portion of the light-passing hole 27.

Figure 9:
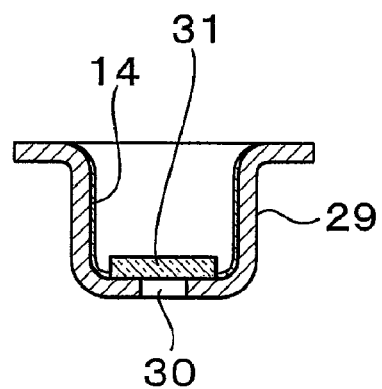
FIG. 9 is an enlarged sectional view of a light-blocking member used in the semiconductor laser module.
Figure 10:
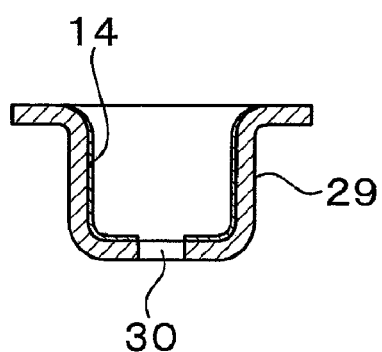
FIG. 10 is an enlarged sectional view showing another example of the light-blocking member.

FIGS. 9 and 10 are enlarged sectional views of the light-blocking member 29. The light-blocking member 29 is shaped like a cap. The light-blocking member 29 has a pore 30 formed in the center of its bottom so that optical fiber incidence light 9 can pass through the pore 30. The light-blocking member 29 is designed so that the outer diameter of a cylindrical portion of the light-blocking member 29 is slightly smaller than the inner diameter of the light-passing hole 27. In the case of the light-blocking member 29 shown in FIG. 9, the pore 30 is blocked with a light-transmissible member 31 of glass etc. In the case of the light-blocking member 29 shown in FIG. 10, the pore 30 is opened as it is. A light-absorbing layer 14 of a black chrome thin film is formed in a range of from the bottom surface to the inner circumferential surface of the light-blocking member 29.

In the structure of the embodiment shown in FIG. 8, the light-blocking member 29 is fixed to the end surface of the sleeve 10 by means of welding, bonding, etc. in advance so that the light-blocking member 29 is inserted and set into the opening portion of the light-passing hole 27 when the sleeve 10 is connected to the front end surface of the holding member 2. Alternatively, the light-blocking member 29 may be fixed to the holding member 2 so that the sleeve 10 can be connected to the holding member 2. As shown in FIG. 8, the light-absorbing layer 14 can be formed also on the inner circumferential surface of the optical fiber side opening portion of the light-passing hole 27.

As shown in FIG. 8, when the light-blocking member 29 is disposed in the inside of the light-passing hole 27, the bottom surface of the light-blocking member 29 against which the reflected light 15 strikes first is disposed in a direction perpendicular to the inner circumferential surface of the light-passing hole 27 and the inner circumferential surface of the light-blocking member 29 is disposed in a direction parallel to the inner circumferential surface of the light-passing hole 27 but is not on the same plane with the inner circumferential surface of the light-passing hole 27.

Figure 11:
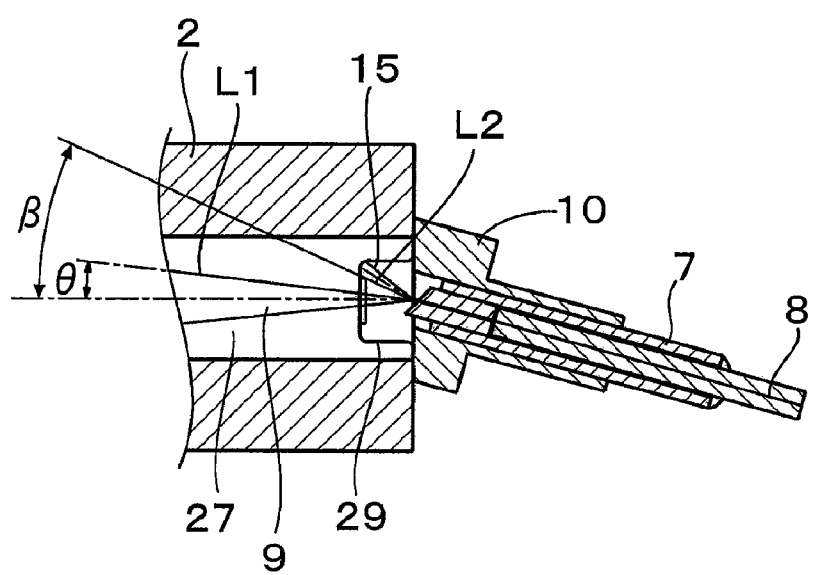
FIG. 11 is a view for explaining the fact that light reflected on an entrance end surface of the optical fiber in the semiconductor laser module is prevented from returning to the laser chip side.

FIG. 11 is a view for explaining the fact that the reflected light 15 does not return to the laser chip 4 side.

When the aforementioned expression (1) is satisfied, the angle β between the principal ray of the optical fiber incidence light 9 and the marginal ray L2 nearest to the principal ray of the optical fiber incidence light 9 in the reflected light 15 from the entrance end surface of the optical fiber is expressed by $\beta=\{2\,(\phi+\psi)-\theta\}$ in which θ is an angle between the marginal ray L1 of the optical fiber incidence light 9 and the principal ray of the optical fiber incidence light 9 at the entrance end surface of the optical fiber 8 shown in FIG. 11. When the relation β>θ is satisfied on this occasion, the optical fiber incidence light 9 and the reflected light 15 can be separated from each other. When the reflected light 15 is led into the light-blocking member 29 so as to be blocked, the reflected light 15 can be surely prevented from returning to the laser chip 4.

Although the light-absorbing layer 14 of a black chrome thin film is used in this embodiment, the light-absorbing layer 14 may be formed by application of a coating material containing a black pigment such as carbon black.

Figure 12:
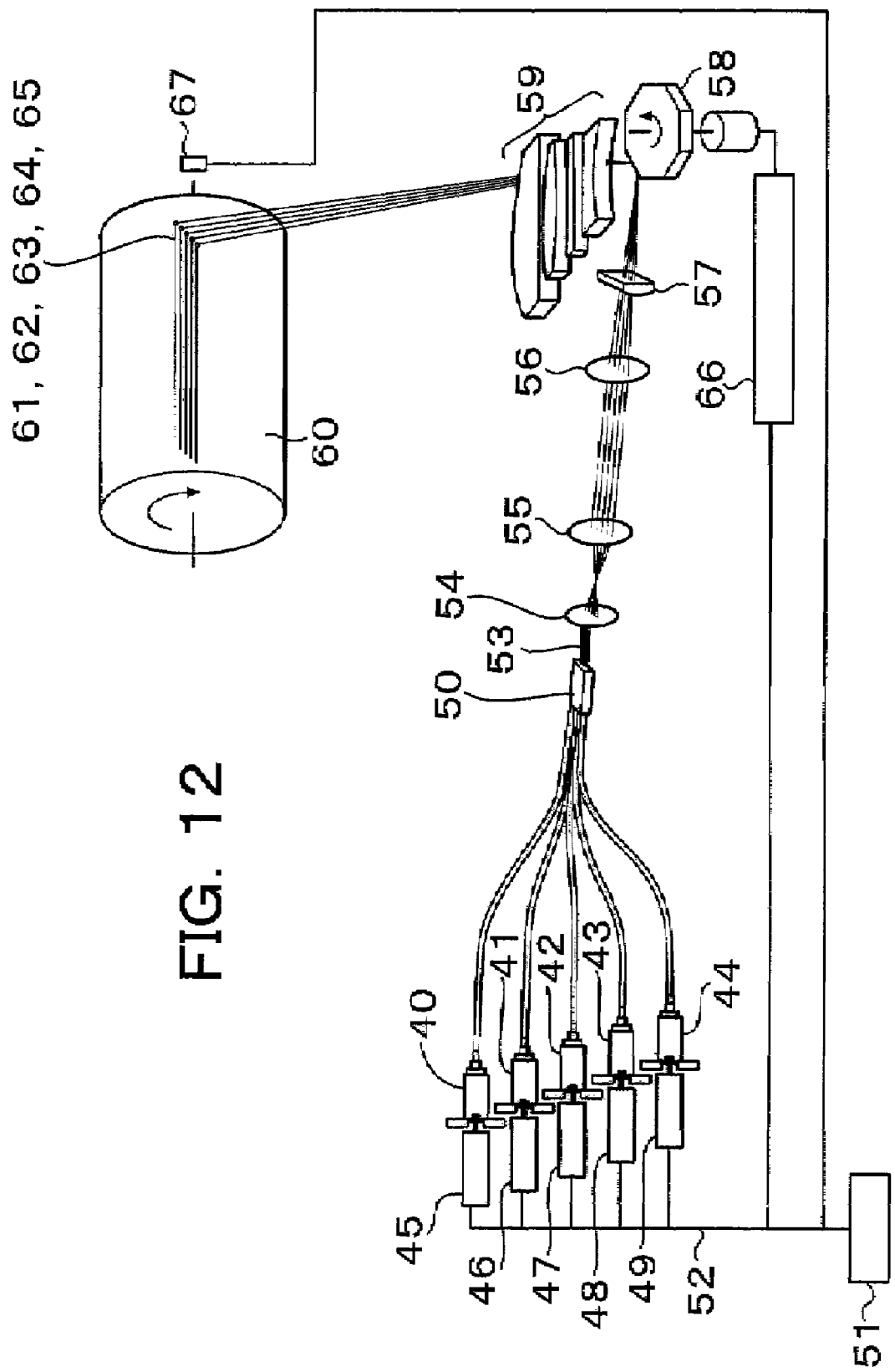
FIG. 12 is a schematic configuration view of a light scanning device using semiconductor laser modules according to any one of the embodiments of the invention.

FIG. 12 is a schematic configuration view of a light scanning device using semiconductor laser modules according to any one of the aforementioned embodiments. When the semiconductor laser modules are mounted in the light scanning device, single mode optical fibers are used in the semiconductor laser modules.

In this example, five semiconductor laser modules as described above are used and laser drivers 45 to 49 are connected to the semiconductor laser modules 40 to 44 respectively. Optical fiber exit ends of the semiconductor laser modules 40 to 44 are arranged into line adjacently to one another so as to form an optical fiber array portion 50 which serves as a light source for generating a plurality of beams.

Upon reception of an image data signal 52 sent from a controller 51, the laser drivers 45 to 49 drive the semiconductor laser modules 40 to 44 to output independently modulated individual beams 53 from a front end of the optical fiber array portion 50, respectively.

After the beams 53 are transmitted through beam-shaping lenses 54 to 57, individually modulated converged light spots 61 to 65 are formed on a photoconductor drum 60 by a rotary multi-faceted mirror 58 of a light-deflecting element and scanning lenses 59 of a scanning optical element, so that optical recording is performed on the photoconductor drum 60. The controller 51 is also connected to a drive circuit 66 of the rotary multi-faceted mirror 58 and a photo-detector 67 for deciding a writing position on the photoconductor drum 60.

Figure 13:
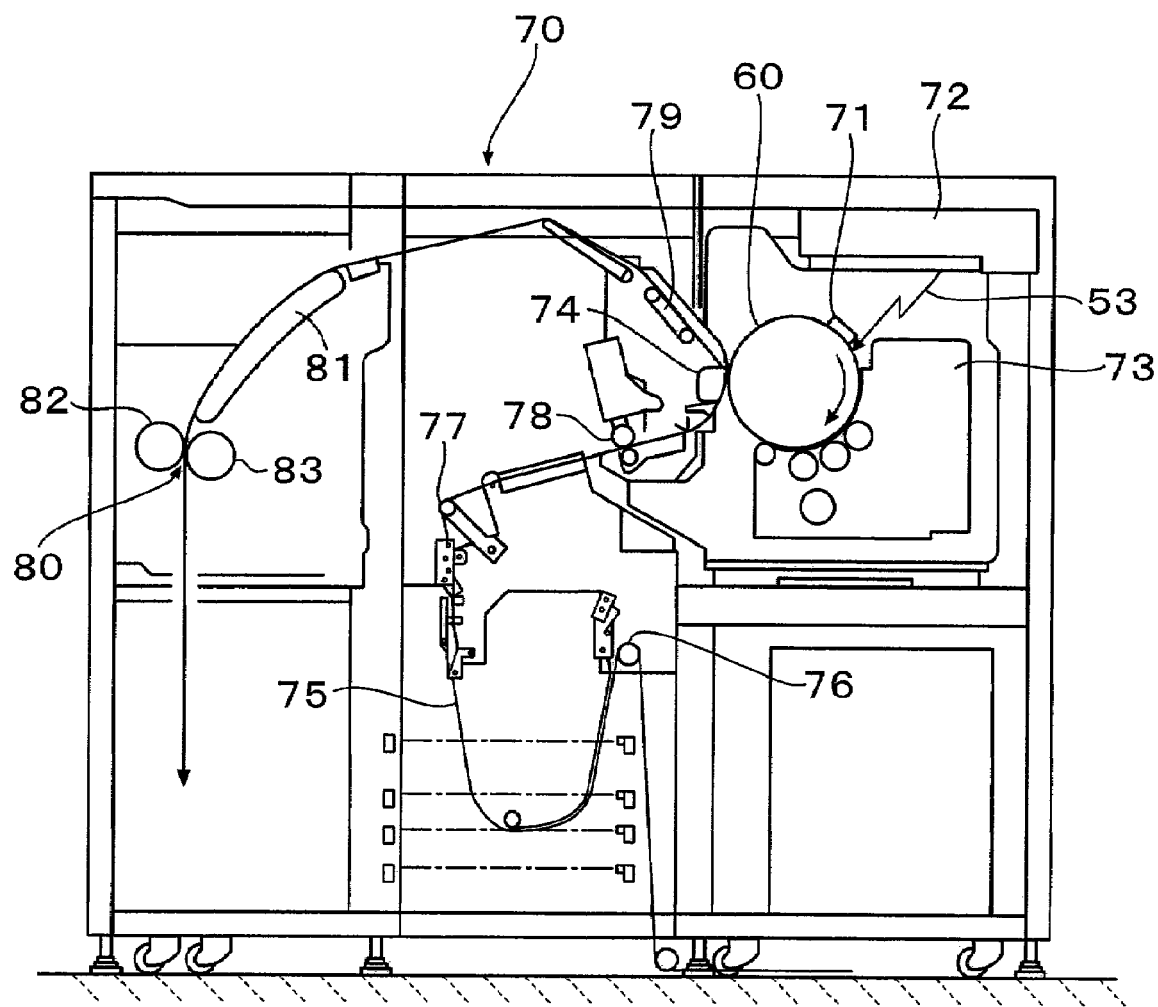
FIG. 13 is a schematic configuration view of an image forming apparatus provided with the light scanning device.
Figure 14:
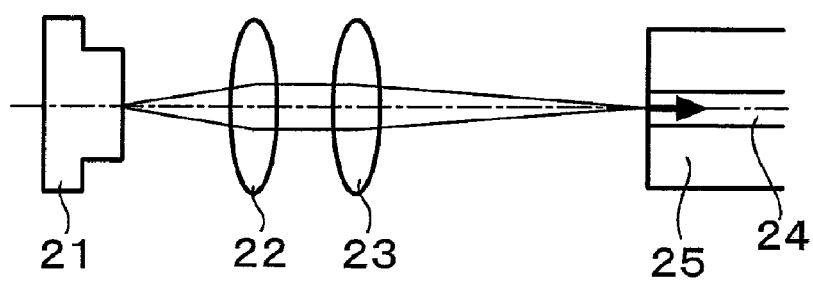
FIG. 14 is a view showing the structure of a system for coupling a semiconductor laser light source and an optical fiber to each other according to a proposal of the background art.
Figure 15:
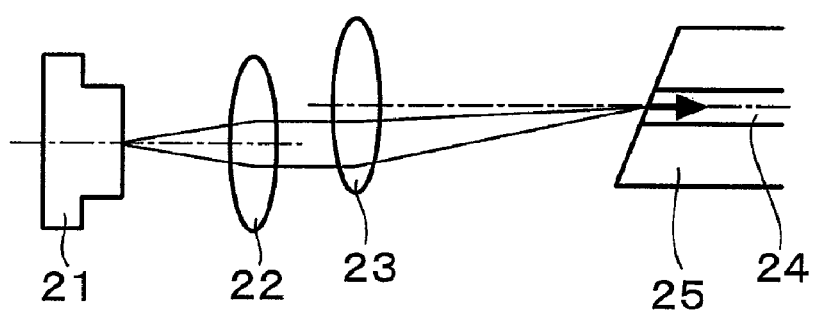
FIG. 15 is a view showing the structure of a system for coupling a semiconductor laser light source and an optical fiber to each other according to a proposal of the background art.
Figure 16:
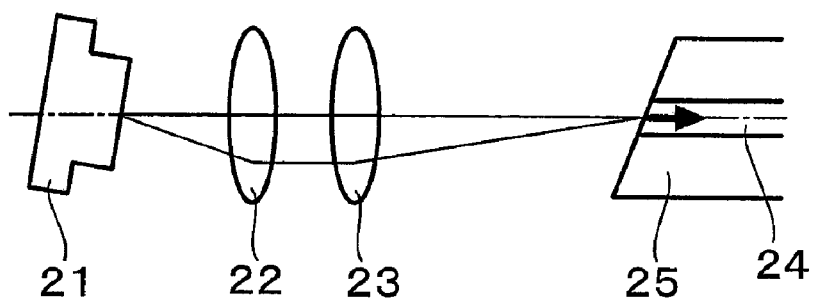
FIG. 16 is a view showing the structure of another system for coupling a semiconductor laser light source and an optical fiber to each other according to a proposal of the background art.

The light scanning device is preferably used in an image forming apparatus such as a printer, a copying machine, a facsimile machine, etc. FIG. 13 is a schematic configuration view of an image forming apparatus represented by a printer equipped with the light scanning device.

In the image forming apparatus 70, an electrostatically charging device 71, a light scanning device 72, a developing device 73, a transfer device 74, etc. are disposed on the periphery of the photoconductor drum 60. A surface of the photoconductor drum 60 is electrostatically charged by the electrostatically charging device 71. The electrostatically charged surface of the photoconductor drum 60 is irradiated with the beams 53 from the light scanning device 72 to thereby form an electrostatic latent image.

When the photoconductor drum 60 rotates clockwise and reaches the developing device 73, the latent image is developed with toner to form a toner image. In the transfer device 74, the toner image is transferred onto a web 75 which is a recording medium. The web 75 is conveyed from a paper tray (not shown) by conveyance devices 76 to 79. In the transfer device 74, the web 75 comes into pressure contact with the photoconductor drum 60 so that the toner image on the photoconductor drum 60 is transferred onto the web 75.

Then, the web 75 is conveyed to a fixing device 80. The fixing device 80 has a pre-heating member 81, a heating roller 82 including a heater (not shown), a pressing roller 83 for pressing the web 75 against the heating roller 82, and so on. Heat and pressure are applied to the web 75 having the transferred toner image, so that the toner image is fixed. Then, the web 75 is fed to a paper discharging portion.

On the other hand, the photoconductor drum 60 from which the toner image has been transferred onto the web 75 further rotates continuously and moves toward the electrostatically charging device 71 so that a next image forming process can be repeated. Since webs 75 are fed successively from the paper tray, formation of images on the webs 75 is performed continuously.

Since the image forming apparatus 70 is equipped with the aforementioned light scanning device (semiconductor laser modules), an image of high quality and high reliability can be formed.

The semiconductor laser module according to the invention can be applied not only to the image forming apparatus but also to other technical fields such as the field of optical communication. Stability and high reliability of semiconductor laser output can be achieved.

The invention claimed is:

1. A semiconductor laser module comprising a semiconductor laser light source, an optical fiber, a lens system by which light emitted from the semiconductor laser light source is condensed on an entrance end surface of the optical fiber, and a holding member which has a light-passing hole formed in the holding member and which holds the semiconductor laser light source in one end portion of the light-passing hole, the optical fiber in the other end portion of the light-passing hole and the lens system in an intermediate portion of the light-passing hole, wherein:

angles of arrangement of the lens system and the optical fiber are set so that an angle β between a principal ray of optical fiber incidence light incident on the optical fiber via the lens system and a marginal ray of reflected light nearest to the principal ray of the optical fiber incidence light when the reflected light is the optical fiber incidence light reflected on the entrance end surface of the optical fiber is larger than an angle θ between the principal ray and a marginal ray of the optical fiber incidence light;

a receiving surface is provided near the other end portion of the light-passing hole and separately from an inner surface of the light-passing hole; and the receiving surface and at least a part of the inner surface of the light-passing hole near the receiving surface are covered with a light-absorbing layer which absorbs the oscillation wavelength of the reflected light so that the reflected light is received by the receiving surface.

2. A semiconductor laser module according to claim 1, wherein the direction of movement of a principal ray of light refracted at the entrance end surface of the optical fiber coincides with the direction of an optical axis of the optical fiber.

3. A semiconductor laser module according to claim 1, wherein the oscillation wavelength of the semiconductor laser light source is not longer than 450 nm.

4. A semiconductor laser module according to claim 1, wherein the receiving surface is provided in a direction perpendicular to the inner surface of the light-passing hole.

5. A semiconductor laser module according to claim 1, wherein the holding member is made of metal while the light-absorbing layer is made of black chrome plating.

6. A semiconductor laser module according to claim 1, wherein the receiving surface is formed from a light-blocking hole which is formed near an end portion of the holding member so as to communicate with the light-passing hole and which has an opening portion blocked.

7. A semiconductor laser module according to claim 1, wherein the receiving surface is formed from an inner surface of a light-blocking recess which is formed near an end portion of the holding member.

8. A light scanning device comprising at least two semiconductor laser modules using single mode optical fibers respectively, an optical fiber array portion formed by arrangement of exit ends of the optical fibers of the semiconductor laser modules, and an optical deflecting element for deflecting and scanning light exiting from the optical fiber array portion so that light deflected by the optical deflecting element is scanned on a scanning surface, wherein
each of the semiconductor laser modules is a semiconductor laser module according to claim 1.

9. An image forming apparatus comprising a photoconductor, an electrostatically charging device for electrostatically charging a surface of the photoconductor, a light scanning device for forming an electrostatic latent image by irradiating light on the electrostatically charged surface of the photoconductor, a developing device for forming a toner image by depositing toner on the electrostatic latent image, a transfer device for transferring the toner image onto a recording medium, and a fixing device for fixing the transferred toner image on the recording medium, wherein
the light scanning device is a light scanning device according to claim 8.

10. A semiconductor laser module according to claim 4, wherein the holding member is made of metal while the light-absorbing layer is made of black chrome plating.

11. A semiconductor laser module according to claim 2, wherein the receiving surface is formed from a light-blocking hole which is formed near an end portion of the holding member so as to communicate with the light-passing hole and which has an opening portion blocked.

12. A semiconductor laser module according to claim 3, wherein the receiving surface is formed from a light-blocking hole which is formed near an end portion of the holding member so as to communicate with the light-passing hole and which has an opening portion blocked.

13. A semiconductor laser module according to claim 4, wherein the receiving surface is formed from a light-blocking hole which is formed near an end portion of the holding member so as to communicate with the light-passing hole and which has an opening portion blocked.

14. A semiconductor laser module according to claim 5, wherein the receiving surface is formed from a light-blocking hole which is formed near an end portion of the holding member so as to communicate with the light-passing hole and which has an opening portion blocked.

15. A semiconductor laser module according to claim 2, wherein the receiving surface is formed from an inner surface of a light-blocking recess which is formed near an end portion of the holding member.

16. A semiconductor laser module according to claim 3, wherein the receiving surface is formed from an inner surface of a light-blocking recess which is formed near an end portion of the holding member.

17. A semiconductor laser module according to claim 4, wherein the receiving surface is formed from an inner surface of a light-blocking recess which is formed near an end portion of the holding member.

18. A semiconductor laser module according to claim 5, wherein the receiving surface is formed from an inner surface of a light-blocking recess which is formed near an end portion of the holding member.

* * * * *